(12) United States Patent
Nozawa et al.

(10) Patent No.: US 9,926,145 B2
(45) Date of Patent: Mar. 27, 2018

(54) CONVEYANCE APPARATUS FOR ELECTRONIC COMPONENTS

(71) Applicant: MURATA MANUFACTURING CO., LTD., Kyoto-fu (JP)

(72) Inventors: Hideaki Nozawa, Nagaokakyo (JP); Tomoyuki Otani, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 0 days.

(21) Appl. No.: 15/497,762

(22) Filed: Apr. 26, 2017

(65) Prior Publication Data

US 2017/0225907 A1 Aug. 10, 2017

Related U.S. Application Data

(63) Continuation of application No. PCT/JP2015/080200, filed on Oct. 27, 2015.

(30) Foreign Application Priority Data

Nov. 6, 2014 (JP) ................................. 2014-225735

(51) Int. Cl.
*B65G 47/14* (2006.01)
*B65G 47/84* (2006.01)

(52) U.S. Cl.
CPC ........... *B65G 47/848* (2013.01); *B65G 47/14* (2013.01); *B65G 47/1428* (2013.01)

(58) Field of Classification Search
CPC .... B65G 47/14; B65G 47/12; B65G 47/1428; B65G 47/1478; B65G 47/1485; B65G 11/203; B65G 47/1435; B65G 47/1407
(Continued)

(56) References Cited

U.S. PATENT DOCUMENTS 6,313,654 B1 * 11/2001 Nansai ............... G01R 31/01
219/412
6,573,739 B1 * 6/2003 Saito ................... G01R 1/0483
324/750.25
(Continued)

FOREIGN PATENT DOCUMENTS

JP -103-240682 A 10/1991
JP -111-208871 A 8/1999
(Continued)

OTHER PUBLICATIONS

International Search Report issued in PCT/JP2015/080200; dated Jan. 12, 2016.
(Continued)

*Primary Examiner* — James R Bidwell
(74) *Attorney, Agent, or Firm* — Studebaker & Brackett PC

(57) ABSTRACT

A conveyance apparatus for electronic components capable of suppressing the adhesion of electronic components to a storing member by static electricity. The conveyance apparatus for electronic components includes: a storing member which includes cavities for storing electronic components respectively; an electronic component supply mechanism which supplies the electronic components in a state where the electronic components are brought into contact with the storing member; and a moving unit which moves the storing member in a predetermined moving direction in a relative relationship with the electronic component, wherein a recessed portion for reducing a contact area of the storing member with the electronic components is formed in a region where the cavities are not formed on a main surface of the storing member on a side where the electronic components are supplied.

12 Claims, 12 Drawing Sheets

(58) Field of Classification Search
USPC .............................. 198/393, 397.01; 209/573
See application file for complete search history.

(56) References Cited

U.S. PATENT DOCUMENTS

| | | | | |
|---|---|---|---|---|
| 8,033,382 B2* | 10/2011 | Sasaoka | ............... | H05K 13/021 198/393 |
| 2002/0050443 A1* | 5/2002 | Kurabe | .............. | B65G 47/1485 198/803.5 |
| 2006/0201781 A1* | 9/2006 | Kodera | .............. | B65G 47/1457 198/393 |
| 2009/0127169 A1* | 5/2009 | Boe | .................... | G01R 31/2893 209/573 |

FOREIGN PATENT DOCUMENTS

| | | | |
|---|---|---|---|
| JP | 2000-501174 | A | 2/2000 |
| JP | 2005-015149 | A | 1/2005 |
| JP | 2007-153477 | A | 6/2007 |
| JP | 2009-113962 | A | 5/2009 |
| JP | 2009-280310 | A | 12/2009 |
| JP | 2009-292556 | A | 12/2009 |
| JP | 2011-503619 | A | 1/2011 |

OTHER PUBLICATIONS

Written Opinion issued in PCT/JP2015/080200; dated Jan. 12, 2016.
International Preliminary Report on Patentability issued in PCT/JP2015/080200; dated May 9, 2017.

* cited by examiner

CONVEYANCE APPARATUS FOR ELECTRONIC COMPONENTS

CROSS REFERENCE TO RELATED APPLICATIONS

This application claims benefit of priority to Japanese Patent Application 2014-225735 filed Nov. 6, 2014 and to International Patent Application No. PCT/JP2015/080200 filed Oct. 27, 2015, the entire content of which is incorporated herein by reference.

TECHNICAL FIELD

The present disclosure relates to a conveyance apparatus for electronic components.

BACKGROUND

It is often the case where electronic components are shipped as products through steps of inspecting electric characteristics, appearance and the like. As a result, various conveyance apparatuses have been proposed for conveying electronic components to steps such as the inspection of the electronic components.

As one of such conveyance apparatuses for electronic components, there has been known a conveyance apparatus for electronic components disclosed in Japanese Patent Application Publication No. 2000-501174.

The conveyance apparatus for electronic components disclosed in Japanese Patent Application Publication No. 2000-501174 includes an electronic circuit part handler 110 as shown in FIG. 13. As a member which is used in the electronic circuit part handler 110, and stores and conveys electronic components, a ring (storing member) 111 shown in FIG. 14 is used.

The electronic circuit part handler 110 also includes: the ring 111 having cavities 111b for storing electronic components; a moving unit 113 for rotating the ring 111 in the circumferential direction; and an electronic component supply mechanism 112 for supplying electronic components to the ring 111. With the rotation of the ring 111, electronic components are stored in the cavities 111b, the stored electronic components are conveyed to a measurement zone, and the measured electronic components are sorted and discharged in a next discharge zone.

The electronic components are charged into a pocket-like hopper 114 from a vibration feeder which forms the electronic component supply mechanism 112, are agitated by the rotation of the ring 111, and are stored into the cavities 111b.

SUMMARY

Problem to be Solved by the Disclosure

However, in the electric circuit part handler 110 described in Japanese Patent Application Publication No. 2000-501174, electronic components slide on the ring 111 and hence, there may be a case where static electricity is generated on the ring 111. When static electricity is generated, the electronic components adhere to a surface of the ring 111 and hence, scraping of the electronic components or the like occurs in a measurement zone which forms a next step thus giving rise to a drawback that a facility is stopped.

The present disclosure has been made to overcome such a drawback, and it is an object of the present disclosure to provide a conveyance apparatus for electronic components capable of suppressing the adhesion of electronic components to a storing member by static electricity.

Means for Solving the Problem

To overcome the above-mentioned drawback, a conveyance apparatus for electronic components according to the present disclosure includes:

a storing member which includes a plurality of cavities configured to store a plurality of electronic components respectively;

an electronic component supply mechanism configured to supply the plurality of electronic components such that the electronic components are brought into contact with the storing member; and a moving unit configured to move the storing member in a predetermined moving direction in a relative relationship with the electronic component supply mechanism, wherein the storing member is configured to be moved so as to displace a position of the storing member relative to the electronic components while being brought into contact with the supplied electronic component so that positions of the cavities formed in the storing member with respect to the electronic components are changed whereby the electronic components are stored in the cavities, and a recessed portion for reducing a contact area of the storing member with the electronic components is provided in a region where the cavities are not formed on a main surface of the storing member on a side where the electronic components are supplied.

In the conveyance apparatus for electronic components according to the present disclosure, it is preferable that the recessed portion be a groove.

Since the recessed portion is a groove, a contact area between the electronic component and the storing member in a region along the groove can be reduced with certainty so that it is possible to suppress the adhesion of the electronic component to the storing member by static electricity.

It is also preferable that a size of the recessed portion in the moving direction of the storing member be smaller than a size of a longest side of the electronic component.

In cases where the electronic component adheres to the storing member, it is often the case where the electronic component adheres to the storing member in a posture where the longest side of the electronic component becomes parallel to the moving direction of the storing member. Accordingly, by setting the size of the recessed portion as described above, it is possible to suppress entrance of the electronic component into the recessed portion.

It is preferable that the electronic component have a rectangular parallelepiped shape with a relationship of length>width≥height, and a size of the recessed portion in a direction orthogonal to the moving direction of the storing member be smaller than the width or the height of the electronic component.

With such a configuration, in cases where the electronic component has a rectangular parallelepiped shape with a relationship of length>width≥height, it is possible to efficiently suppress the entrance of the electronic component into the recessed portion.

It is preferable that the electronic component have a rectangular parallelepiped shape with a relationship of length>width≥height, the storing member be rotatably moved by the moving unit about an axis of rotation thereof, the groove is formed concentrically about the axis of rotation of the storing member, and a size of the groove in a direction orthogonal to the moving direction is smaller than the width or the height of the electronic component.

With such a configuration, in cases where the electronic component has a rectangular parallelepiped shape having a relationship of length>width≥height, it is possible to efficiently suppress the entrance of the electronic component into the groove.

It is preferable that the electronic component have a rectangular parallelepiped shape having a relationship of length>width≥height, and in cases where the recessed portion is located adjacent to the cavity in a direction orthogonal to the moving direction of the storing member, a distance between the cavity and the recessed portion located adjacent to each other be smaller than the width or the height of the electronic component.

With the above-mentioned configuration, in cases where the electronic component is formed into a rectangular parallelepiped shape with a relationship of length>width≥height, a contact area between the electronic component and the storing member can be reduced so that it is possible to suppress the adhesion of the electronic component to the storing member by static electricity.

It is preferable that in cases where the recessed portions are located adjacent to each other with no cavity interposed therebetween in the moving direction of the storing member, a distance between the recessed portions located adjacent to each other with no cavity interposed therebetween be set smaller than a size of a longest side of the electronic component.

The distance between the recessed portions located adjacent to each other with no cavity interposed therebetween in the moving direction of the storing member is smaller than the size of the longest side of the electronic component. Accordingly, a contact area between the electronic component and the storing member can be reduced and hence, it is possible to suppress the adhesion of the electronic component to the storing member by static electricity.

In cases where the recessed portion is located adjacent to the cavity in the moving direction of the storing member, it is preferable that a distance between the cavity and the recessed portion located adjacent to each other be smaller than a size of a longest side of the electronic component.

The distance between the cavity and the recessed portion located adjacent to each other in the moving direction of the storing member is smaller than the size of the longest side of the electronic component. Accordingly, a contact area between the electronic component and the storing member can be reduced so that it is possible to suppress the adhesion of the electronic component to the storing member by static electricity.

It is also preferable that the recessed portion having a size which allows a portion of the electronic component to enter the recessed portion be configured such that the center of gravity of the electronic component is positioned outside the recessed portion in a state where a portion of the electronic component enters the recessed portion and is brought into contact with a bottom surface of the recessed portion.

The recessed portion is configured such that the center of gravity of the electronic component is positioned outside the recessed portion even when the portion of the electronic component enters the recessed portion and is brought into contact with the bottom surface of the recessed portion. Accordingly, a force of driving out the electronic component in a direction toward the outside of the recessed portion acts and hence, it is possible to suppress the occurrence of a state where the electronic component enters the recessed portion and is held in the recessed portion.

It is preferable that the electronic component have a rectangular parallelepiped shape with a relationship of length>width≥height, a depth of the recessed portion be smaller than a half of the height of the electronic component, and be smaller than a half of the width of the electronic component.

The depth of the recessed portion is smaller than a half of the height of the electronic component and is smaller than a half of the width of the electronic component. Accordingly, in cases the electronic component has a rectangular parallelepiped shape with a relationship of length>width≥height, an amount of entrance when the electronic component enters the recessed portion becomes small so that it is possible to position the center of gravity of the electronic component outside the recessed portion with certainty. As a result, it is possible to suppress the occurrence of a state where the electronic component enters the recessed portion and is held in the recessed portion.

It is preferable that the electronic component have a rectangular parallelepiped shape, and the recessed portion having a size which allows a portion of the electronic component to enter the recessed portion have at least one of a curved portion and a projecting portion on at least a portion of a bottom surface of the recessed portion.

In cases where at least one of the curved portion and the projecting portion is formed on at least a portion of the bottom surface of the recessed portion, a contact area of the electronic component with the bottom surface when the electronic component enters the recessed portion becomes small so that the electronic component can be easily removed from the recessed portion. Accordingly, it is possible to suppress the adhesion of the electronic component in the recessed portion.

It is preferable that the moving direction of the storing member make a predetermined angle with respect to a horizontal plane.

In cases where the moving direction of the storing member makes a predetermined angle with respect to a horizontal plane, even when the electronic component enters the recessed portion, the electronic component can be easily removed from the recessed portion due to its own weight.

Advantageous Effect of the Disclosure

In the conveyance apparatus for electronic components according to the present disclosure, the recessed portion is formed in a region where the cavity of the storing member is not formed and hence, a contact area between the electronic component and the storing member is reduced. Accordingly, it is possible to suppress the occurrence of static electricity generated by contacting and sliding between the electronic component and the storing member. Further, even when static electricity is generated, since the contact area between the electronic component and the storing member is small and hence, an attraction force generated by static electricity to the electronic component becomes small so that it is possible to suppress the adhesion of the electronic component to a region of the storing member where the cavity is not formed.

BRIEF DESCRIPTION OF THE DRAWINGS

FIGS. 1(a) and 1(b) are views for describing a conveyance apparatus for electronic components according to an embodiment of the present disclosure, wherein FIG. 1(a) is a left side view and FIG. 1(b) is a front view.

DETAILED DESCRIPTION

A conveyance apparatus 10 for electronic components 1 is used for conveying the electronic components 1 in performing characteristic sorting of the electronic components 1 based on characteristics of the electronic components 1, appearance sorting of the electronic components 1 based on appearances of the electronic components 1, packaging of the electronic components 1 using carrier tapes, delivery of the electronic components 1 to a tray, forming of external electrodes and the like, for example.

In this embodiment, the description is made by taking a conveyance apparatus used in a characteristic sorting machine for sorting characteristics of the electronic components 1 as an example.

Figure 1A:
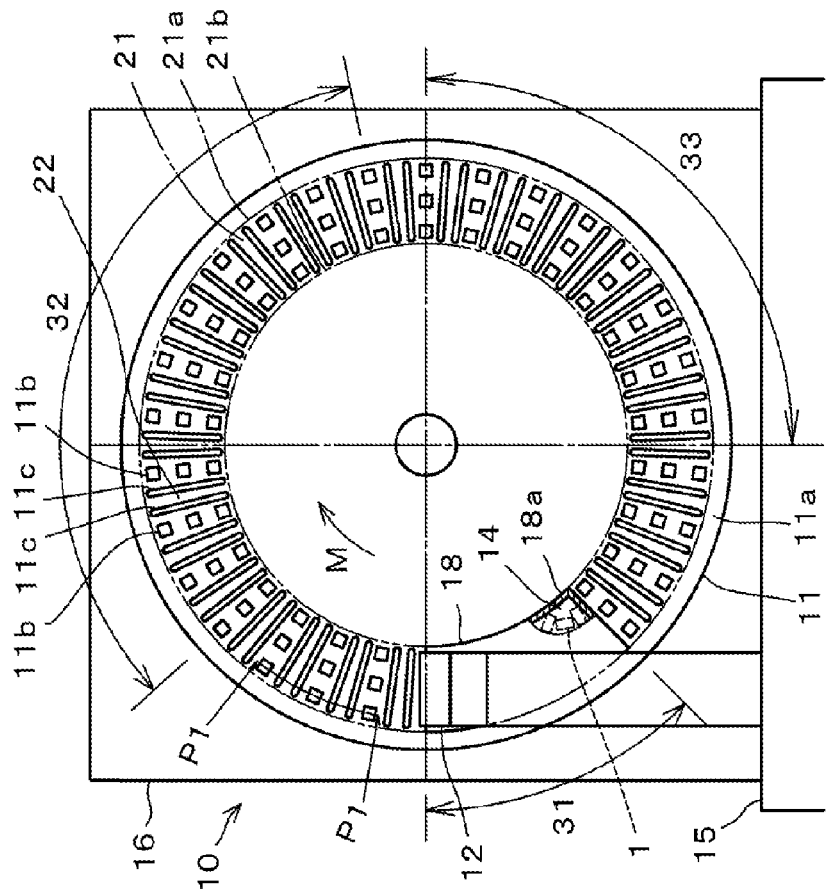
Figure 1B:
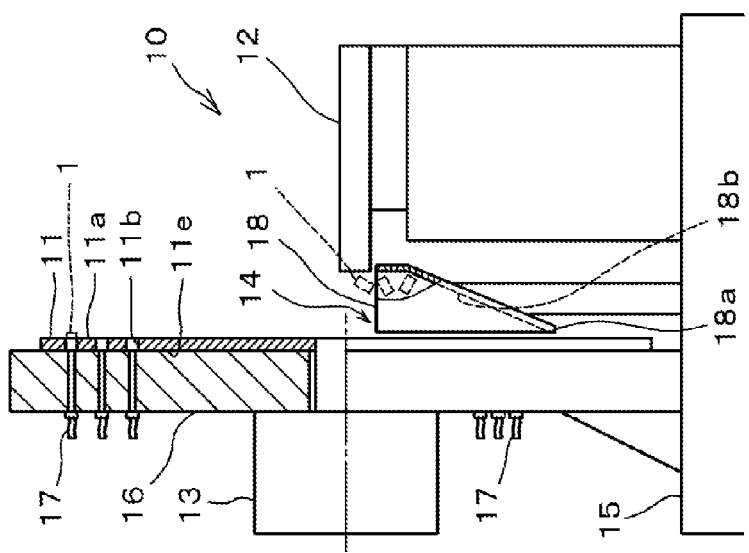

The characteristic sorting machine 30 includes, as shown in FIG. 1(b), a supply zone 31 for supplying the electronic components 1, a measurement zone 32 for measuring electric characteristics of the electronic components 1 and a discharge zone 33 for discharging the electronic components 1.

First, in the supply zone 31, the electronic components 1 are stored in the storing member 11, and conveyed to the measurement zone 32. In the measurement zone 32, characteristics of the electronic components 1 are measured. Then, the electronic components 1 are sorted based on a result of the measurement, and are discharged to the outside of the system in the discharge zone 33.

The conveyance apparatus 10 according to the embodiment of the present disclosure is, in the characteristic sorting machine 30, configured to perform a function of conveying electronic components to the measurement zone 32 and the discharge zone 33.

Figure 2:
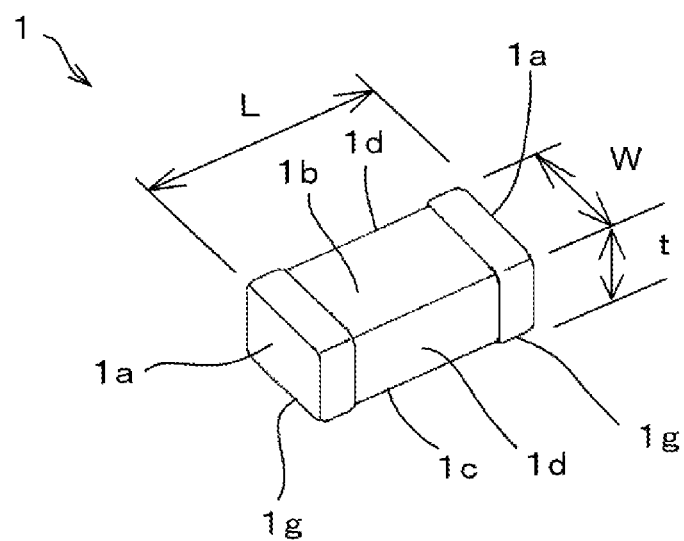
FIG. 2 is a view for describing an electronic component which is an object to be conveyed according to the embodiment of the present disclosure.

As the electronic component 1 which is an object to be conveyed, a stacked ceramic capacitor or the like is named. For example, as shown in FIG. 2, the electronic component 1 has a rectangular parallelepiped shape which is defined by both end surfaces 1a, an upper surface 1b, a lower surface 1c and both side surfaces 1d. Internal electrodes (not shown in the drawing) are led out from both end surfaces 1a of the electronic component 1, and external electrodes 1g are formed such that the external electrodes 1g are connected with the internal electrodes. Corner portions of the electronic component 1 are rounded by chamfering.

In the electronic component 1, a size of a long side (length: L) of the upper surface 1b, a size of a short side (width: W) of the upper surface 1b and a distance (height: t) between the upper surface 1b and the lower surface 1c have a relationship of length L>width W>height t. However, the present disclosure is also applicable to the case where the electronic component 1 has a relationship of length L>width W≥height t.

As shown in FIGS. 1(a) and 1(b), the conveyance apparatus 10 includes: an electronic component supply mechanism 12 for supplying the electronic components 1; the storing member 11 having cavities 11b for storing the electronic components 1; and a moving unit 13 for moving the storing member 11 in a predetermined moving direction M.

The electronic component supply mechanism 12 is a mechanism for conveying the plurality of electronic components 1 toward the storing member 11, and brings the electronic components 1 into contact with the storing member 11. The electronic component supply mechanism 12 is mounted on a base plate 15.

For example, a vibration feeder, a belt feeder and the like can be used as the electronic component supply mechanism 12. The electronic components 1 supplied by the electronic component supply mechanism 12 are charged into a hopper 14 where the electronic components 1 are temporarily stored.

The storing member 11 is a member having a circular disc shape. The storing member 11 has cavities 11b for storing the electronic components 1, and is configured to be rotated about an axis of rotation thereof by the moving unit 13. With such rotation, the electronic components 1 are stored in the cavities 1ib formed on the storing member 11 and are conveyed.

For example, a servo motor is used as the moving unit 13. The moving unit 13 is fixed to the base plate 15 by way of a vertical plate 16. Suction units 17 which hold by suction the electronic components 1 in conveyance from a back surface 11e side of the storing member 11 are mounted on the vertical plate 16.

The hopper 14 is a region which is surrounded by the storing member 11 and a cover 18 which covers a portion of the main surface 11a of the storing member 11, and is configured to cover the plurality of cavities 1ib formed on the storing member 11 in the supply zone 31. The hopper 14 has an opening on an upper side, and is configured to allow charging of the electronic components 1 into the hopper 14 from the opening. A wall surface 18b of the cover 18 is inclined so as to approach the main surface 11a of the storing member 11 as the wall surface 18b extends downward. Accordingly, the charged electronic components 1 move such that the electronic components 1 are brought into contact with the main surface 11a of the storing member 11 along the wall surface 18b due to its own weight.

The storing member 11 is disposed such that the main surface 11a of the storing member 11 is parallel to the vertical direction. As a material for forming the storing member 11, a resin material, a glass material, a ceramic material such as zirconia and the like can be used. All these materials are materials which easily generate static electricity.

Figure 3:
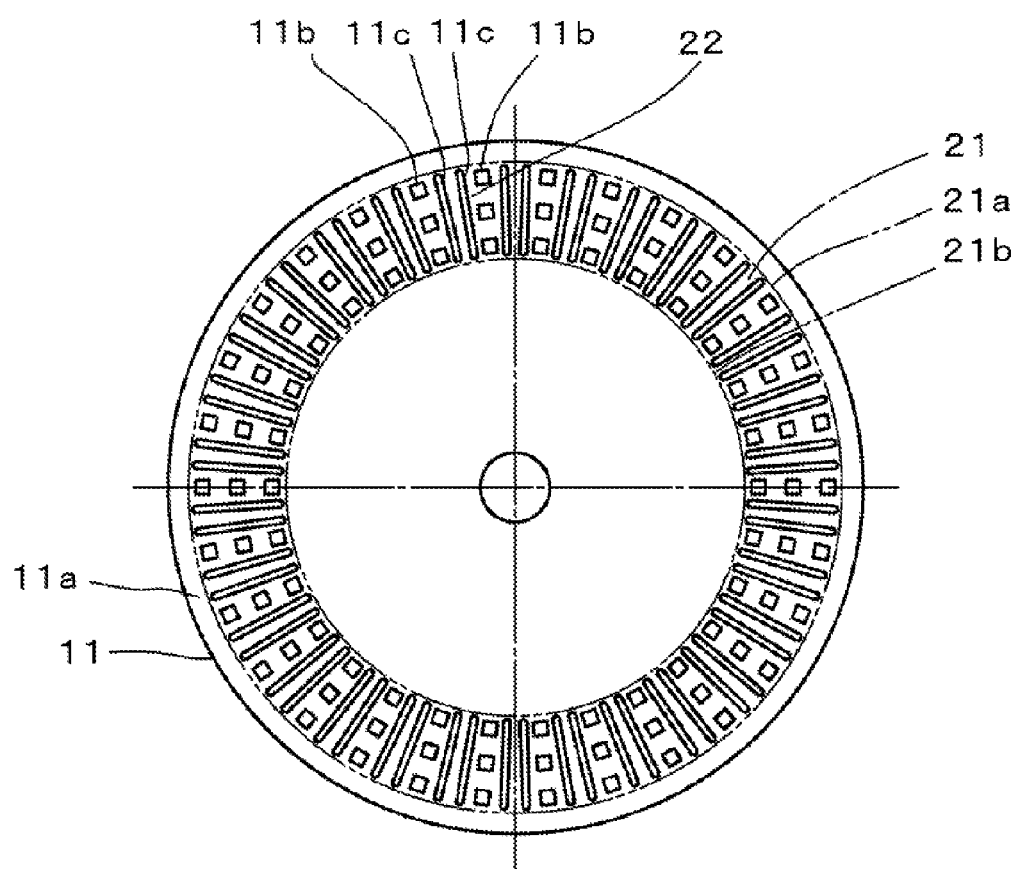
FIG. 3 is a front view of a storing member of the conveyance apparatus shown in FIGS. 1(a) and 1(b).

As shown in FIG. 3, a plurality of cavities (through holes) 11b provided for storing the plurality of electronic components 1 respectively are formed in the storing member 11. Further, on a surface of the storing member 11, recessed portions 11c are formed for suppressing the adhesion of the electronic components 1 caused by static electricity by reducing a contact area of the storing member 11 with the electronic components 1.

The cavity 11b which penetrates the storing member 11 is configured to have a size which allows the entrance of the electronic component 1 from an end-surface 1a side. A plurality of rows (three rows in FIG. 3) each of which is formed of a plurality of cavities 11b are formed on the main surface 11a of the storing member 11 concentrically.

The recessed portions 11c are formed in regions 22 where the cavities 11b are not formed. The recessed portion 11c has a groove shape, and is formed radially with respect to the center of rotation of the storing member 11. A plurality of (two in FIG. 3) recessed portions 11c are formed between the cavities 11b located adjacent to each other in a circumferential direction.

Figure 4:
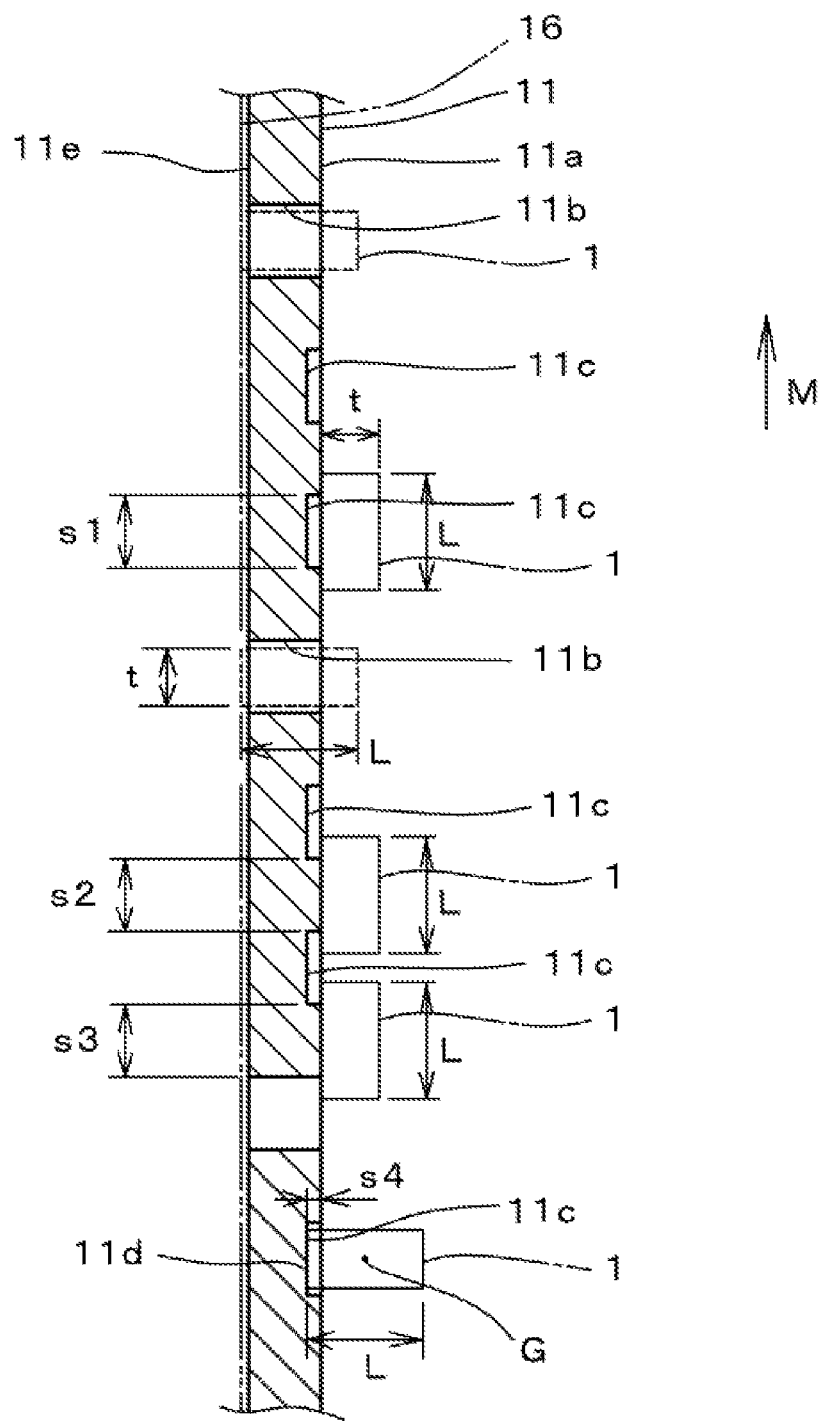
FIG. 4 is an enlarged view showing a cross-section of the storing member shown in FIG. 1(b) taken along line 4-4 in a developed manner, and also is a view for describing a size relationship between an electronic component, a recessed portion formed on the storing member and a cavity formed on the storing member.

FIG. 4 is an enlarged view showing a cross-section of the storing member shown in FIG. 1 taken along line 4-4 in a developed manner. In FIG. 4, an upward direction on the paper on which FIG. 4 is drawn is indicated as a moving direction M of the storing member 11.

As shown in FIG. 4, a size s1 of the recessed portion 11c in the moving direction M of the storing member 11 is set smaller than a size of a longest side (length: L) of the electronic component 1. In cases where the electronic components 1 adhere to the storing member 11, it is often the case where the electronic components 1 adhere to the storing member 11 in a posture where the longest side of the electronic component 1 becomes parallel to the moving direction M of the storing member 11. Accordingly, by setting the size of the recessed portion 11c as described above, the entrance of the electronic component 1 into the recessed portion 11c can be suppressed.

Further, a distance s2 between the recessed portions 11c located adjacent to each other with no cavity 11b interposed therebetween is set smaller than the size of the longest side (length: L) of the electronic component. A distance s3 between the cavity 11b and the recessed portion 11c located adjacent to each other is set smaller than the size of the longest side (length: L) of the electronic component. With such a configuration, a contact area between the electronic component 1 and the storing member 11 can be reduced.

The recessed portion 11c is formed such that the center of gravity G of the electronic component 1 is positioned outside the recessed portion 11c in a state where a portion of the electronic component 1 enters the recessed portion 11c and is brought into contact with a bottom surface 11d. For example, a depth s4 of the recessed portion 11c is set to a half of a height t of the electronic component 1 and smaller than a half of a width W of the electronic component 1. With such a configuration, even when the electronic component 1 enters the recessed portion 11c, a force of driving out the electronic component 1 in a direction toward the outside of the recessed portion 11c acts and hence, it is possible to suppress the occurrence of a state where the electronic component 1 enters the recessed portion 11c and is held in the recessed portion 11c.

The manner of operation of the conveyance apparatus 10 is described.

In conveying the electronic components 1 using the conveyance apparatus 10, first, the storing member 11 is rotated in a clockwise direction (M direction indicated by an arrow) as viewed from a front side by the moving unit 13.

Then, the electronic components 1 are supplied toward the storing member 11 by the electronic component supply mechanism 12.

The storing member 11 is rotated such that the relative positions of the storing member 11 with respect to the electronic components 1 are displaced while generating sliding between the storing member 11 and the plurality of electronic components 1 stored in the hopper 14.

With such an operation, the positions of the cavities 11b of the storing member 11 with respect to the electronic components 1 are changed so that the electronic components 1 are stored in the cavities 11b. The stored electronic components 1 are conveyed in a state where one end surface 1a of the electronic components 1 is brought into contact with the vertical plate 1.

At this stage of operation, the storing member 11 is rotated while being in contact with the electronic components 1 and hence, static electricity is liable to be generated. However, the recessed portions 11c are formed on the main surface 11a of the storing member 11 and hence, the generation of static electricity is suppressed.

Even if static electricity is generated, since a contact area between the electronic components 1 and the storing member 11 is small, an attraction force to the electronic components 1 is decreased. Accordingly, the adhesion of the electronic components 1 to the storing member 11 is suppressed.

In cases where the electronic components 1 adhere to the storing member 11, it is often the case where the electronic components 1 adhere to the storing member 11 in a posture where the longest side (length: L) of the electronic component 1 becomes parallel to the moving direction M of the storing member 11. Accordingly, as in the case of the conveyance apparatus of this embodiment, by setting the size s1 of the recessed portion 11c smaller than the length L of the electronic component 1, it is possible to suppress or prevent the entrance of the electronic component 1 into the recessed portion 11c. Further, by setting the size s1 of the recessed portion 11c to a value which is smaller than the length L of the electronic component 1 and is larger than the height t of the electronic component 1, a contact area between the storing member 11 and the electronic components 1 can be reduced so that the occurrence of static electricity is suppressed. Further, an attraction force to the electronic components 1 can be decreased and hence, the adhesion of the electronic components to the storing member 11 can be suppressed or prevented.

Electronic components are conveyed using the conveyance apparatus 10 having the above-mentioned configuration, and an adhesion state of the electronic components 1 to the main surface of the storing member is observed. As a result of the observation, the adhesion of the electronic components 1 is not confirmed even after a lapse of 40 minutes from the start of the operation.

On the other hand, in a conveyance apparatus which uses a storing member having no recessed portions, the adhesion of electronic components 1 is confirmed within one minute from the start of an operation.

In this embodiment, the region where the recessed portions 11c are formed is not always a whole region of the main surface 11a of the storing member 11 except for the cavities 11b, and may be a region 21 where the electronic components 1 are brought into contact with the storing member 11 when the electronic components 1 are supplied to the storing member 11 (a region corresponding to the supply zone 31). To be more specific, as shown in FIG. 1(b), it is sufficient that the region where the recessed portions 11c are formed be a circular annular region where the storing member 11 in the midst of rotational movement and the hopper 14 overlap with each other (a region sandwiched by chain lines 21a, 21b) as viewed in a front side of the conveyance apparatus 10.

The arrangement direction of the storing member 11 is not limited to a vertical direction and may be also a horizontal direction. However, by arranging the storing member 11 with a moving direction M of the storing member 11 inclined with respect to a horizontal plane by a predetermined angle rather than arranging the storing member 11 in the horizontal direction, the electronic components 1 which are not stored in the cavities 11b can be moved downward by making use of their own weight of the electronic components 1 and hence, a step of scraping off the electronic components 1 not stored in the cavities 11b becomes unnecessary. Accordingly, the arrangement of the storing member 11 with inclination is preferable. Further, in cases where the storing member 11 having a large area is used for increasing the number of cavities, an area of facility becomes smaller by arranging the storing member 11 in the vertical direction. Accordingly, it is preferable to arrange the storing member 11 in the vertical direction.

Driving of the storing member 11 by the moving unit 13 may be continuous driving or intermittent driving. In cases where an operator wants to apply a force generated by acceleration to the electronic component 1 so as to shake off the electronic component 1 adhering to the storing member 11, it is desirable to adopt intermittent driving where movement and stop are repeated. In this movement, either one of or both of the moving unit 13 and the electronic component supply mechanism 12 may be moved. That is, the movement of the storing member 11 may be the relative movement with respect to the electronic component supply mechanism 12.

In the conveyance apparatus 10 of this embodiment, the storing member 11 which includes the recessed portions 11c each having a flat bottom surface is used. However, the storing member 11 which includes the recessed portions as shown in FIG. 5(a) and FIG. 5(b) may be used.

Figure 5A:
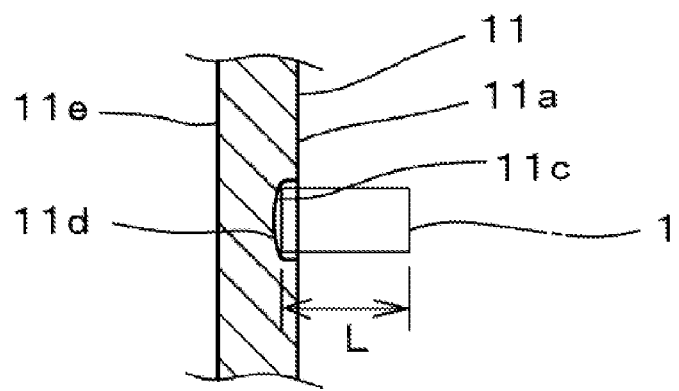
FIGS. 5(a) and 5(b) are views for describing another example of the recessed portion formed on the storing member.

In the storing member 11 shown in FIG. 5(a), the recessed portion 11c has a curved portion formed by indenting a portion of a bottom surface 11d of the recessed portion 11c. To be more specific, the recessed portion 11c is formed such that a part of the bottom surface 11d is curved toward a back surface 11e side of the storing member 11. With such a configuration, a contact area between the electronic component 1 and the bottom surface 11d when the electronic component 1 enters the recessed portion 11c is decreased and hence, the electronic component 1 is easily removed from the recessed portion 11c.

Figure 5B:
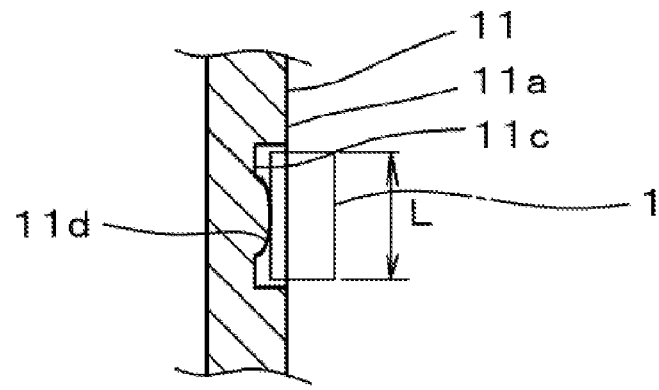

In the storing member 11 shown in FIG. 5(b), the recessed portion 11c has a projecting portion formed by raising a portion of the bottom surface 11d of the recessed portion 11c toward a main surface 11a side. Even when the storing member 11 having such a configuration is used, the conveyance apparatus for electronic components can acquire substantially the same advantageous effects as the case where the storing member 11 having the configuration shown in FIG. 5(a) is used.

Figure 6:
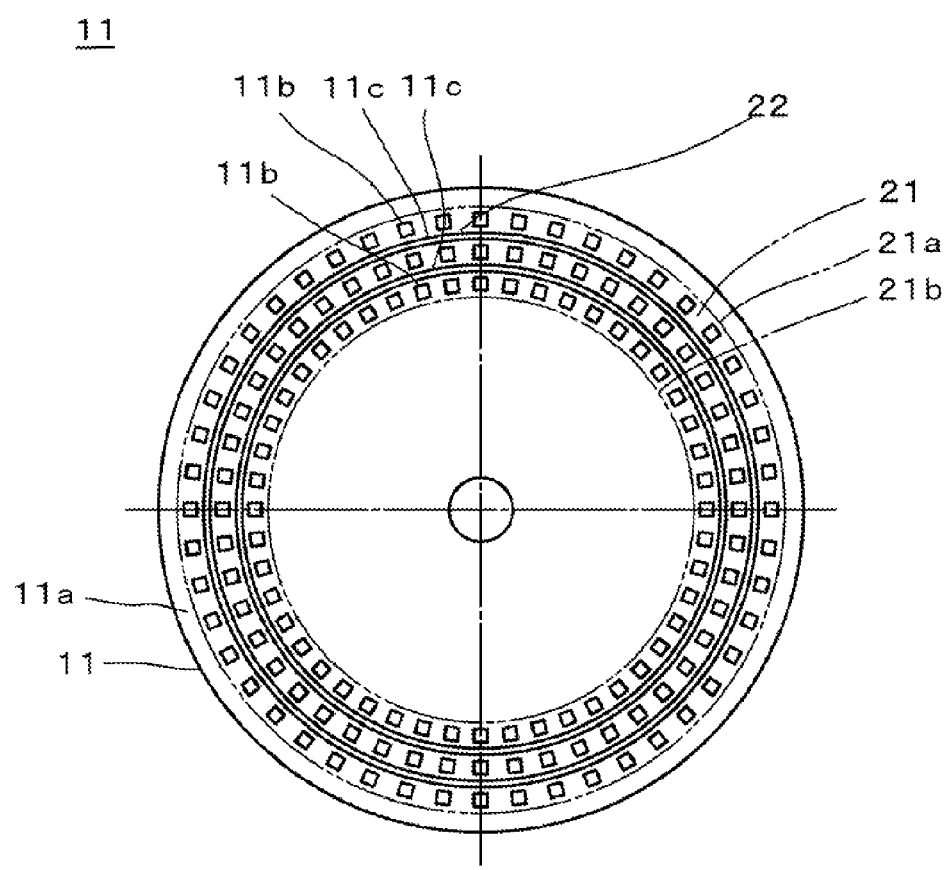
FIG. 6 is a view showing another example of the storing member shown in FIG. 3.
Figure 7:
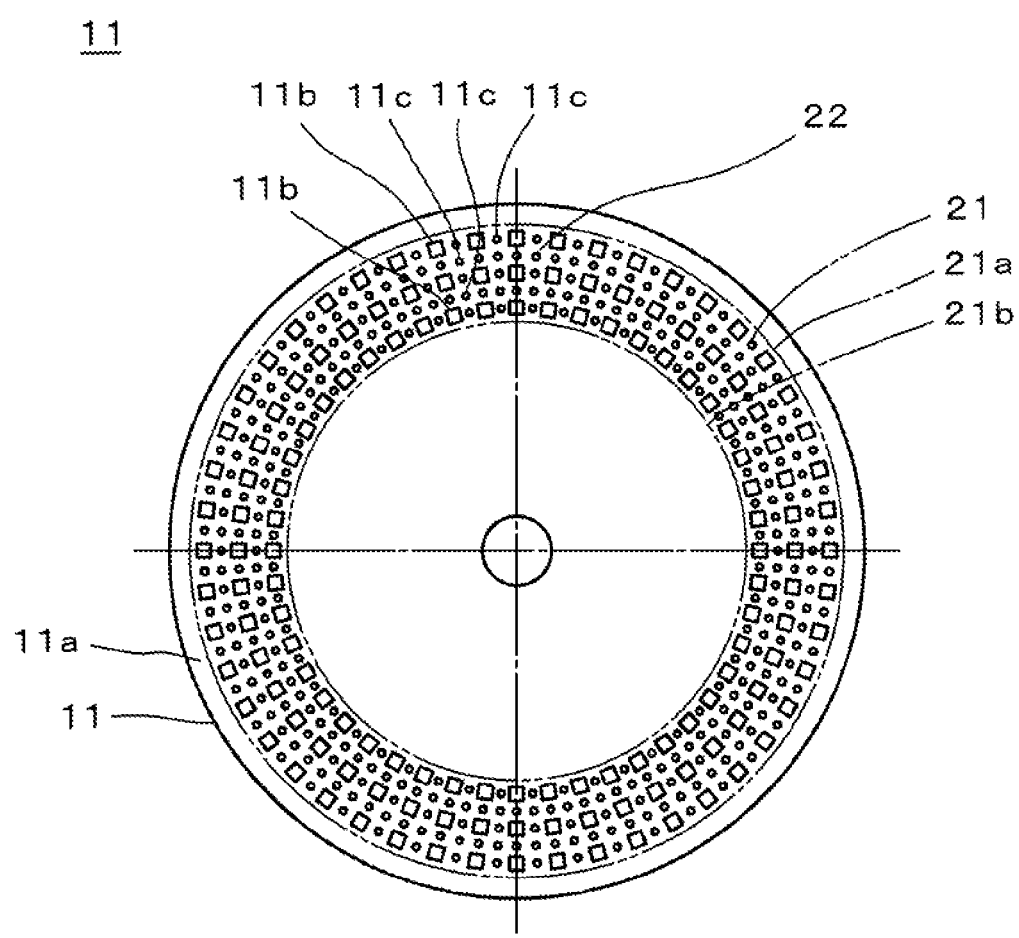
FIG. 7 is a view showing another example of the storing member shown in FIG. 3.
Figure 8:
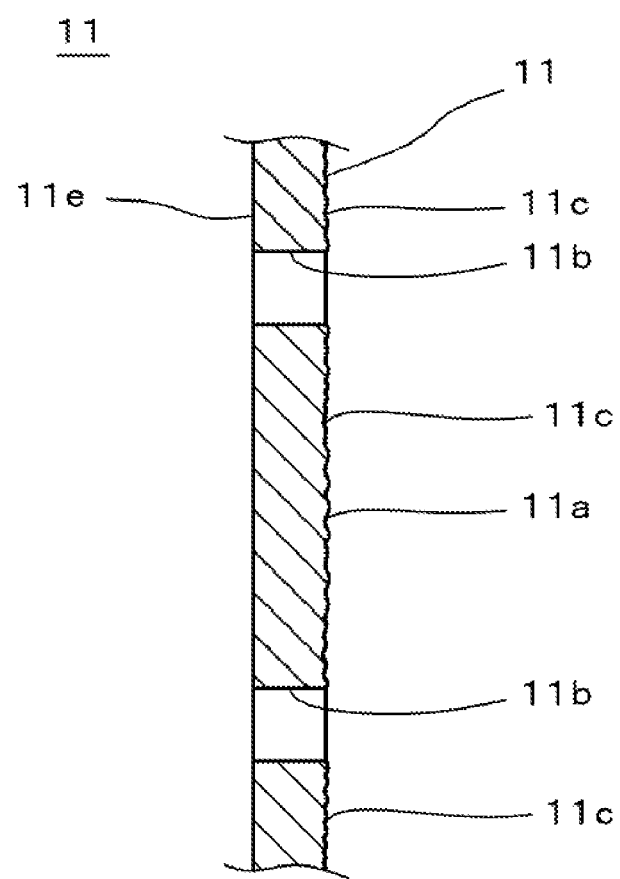
FIG. 8 is a view showing another example of the storing member shown in FIG. 3, and is also an enlarged cross-sectional view of the storing member as viewed from a side.

It is also possible to use storing members 11 shown in FIG. 6 to FIG. 8.

In the storing member 11 shown in FIG. 6, recessed portions 11c are formed on the storing member 11 concentrically. To be more specific, the groove-shaped recessed portion 11c is formed between cavities 11b arranged in three rows in the radial direction. A size of a groove width of the recessed portion 11c is set smaller than a width W of the electronic component 1, for example. Even when the storing member 11 having such a configuration is used, it is possible to decrease a contact area between the electronic component 1 and the storing member 11.

With the above-mentioned configuration, it is possible to make it difficult for the electronic component 1 to enter the recessed portion 11c. Further, even if the electronic component 1 enters the recessed portion 11c, the electronic component 1 enters the recessed portion with a side surface 1d side thereof heading toward the recessed portion. Accordingly, compared to a case where the electronic component 1 enters the recessed portion with an upper surface 1b side thereof heading toward the recessed portion 11c or a lower surface 1c side thereof heading toward the recessed portion 11c, the electronic component 1 projects from the recessed portion 11c and hence, the electronic component 1 is easily removed from the recessed portion 11c.

The groove-shaped recessed portion 11c shown in FIG. 6 is formed such that a size of the recessed portion 11c in a direction orthogonal to a moving direction M of the storing member 11 is set smaller than a width W or a height t of the electronic component 1. Accordingly, when the electronic component 1 has a rectangular parallelepiped shape having a relationship of length L>width≥W height t, it is possible to suppress the entrance of such an electronic component 1 into the recessed portion 11c.

The groove-shaped recessed portion 11c is formed such that a distance between the cavity and the recessed portion 11c located adjacent to each other in a direction orthogonal to the moving direction of the storing member M is set smaller than the width W or the height t of the electronic component 1. Accordingly, when the electronic component 1 has a rectangular parallelepiped shape having a relationship of a length L>width W≥height t, it is possible to decrease a contact area between the electronic component 1 and the storing member 11.

A storing member having both the radially extending recessed portions shown in FIG. 3 and the above-mentioned concentric recessed portions may be used in the conveyance apparatus 10. A storing member on which groove-shaped recessed portions inclined with respect to the moving direction are formed may be used in the conveyance apparatus 10. A storing member where groove-shaped recessed portions extending in an inclined manner with respect to the moving direction intersect with each other in a mesh shape may be used in the conveyance apparatus 10.

Provided that a size of the recessed portion in the moving direction M of the storing member 11 is set smaller than a size of the longest side of the electronic component 1, the entrance of the electronic component 1 into the recessed portion can be suppressed regardless of the shape of the recessed portion.

In the storing member 11 shown in FIG. 7, recessed portions 11c having a predetermined area are formed in an interspersed manner like dots. To be more specific, each recessed portion 11c is disposed between cavities 11b disposed in three rows in the radial direction and between the cavities 11b located adjacent to each other in the circumferential direction. The recessed portion 11c has a circular shape and a diameter of the recessed portion 11c is set smaller than a length L of the electronic component 1. Also with the use of the storing member 11 having such a configuration, it is possible to decrease a contact area between the electronic component 1 and the storing member 11. Further, in this case, it becomes difficult for the electronic component 1 to enter the recessed portion 11c.

A diameter of the recessed portion 11c may be set smaller than a width W of the electronic component 1. In this case, it becomes more difficult for the electronic component 1 to enter the recessed portion 11c.

It is not always necessary that all recessed portions 11c are formed like dots, and some of the plurality of recessed portions 11c may be formed in a communicating manner.

In the storing members 11 shown in FIG. 3, FIG. 6 and FIG. 7, the recessed portions 11c and the cavities 11b are formed in a spaced-apart manner from each other. However, the recessed portions 11c and the cavities 11b may be formed in a communicating manner provided that the storing member 11 is formed in a mode that storing of the electronic component 1 in the cavity is not obstructed.

A storing member 11 shown in FIG. 8 is formed such that the whole surface of a main surface 11a except for cavities 11b is formed with unevenness so as to have a predetermined surface roughness. The main surface 11a of the storing member 11C can be worked by a sand paper, a sand blast, brushing, etching or the like. In place of applying such surface working to the storing member 11, a material having roughness on a surface thereof to some extent such as a porous material may be used for forming the storing member 11. Even when the storing member 11 having such a configuration is used, it is possible to decrease a contact area between the electronic component 1 and the storing member 11.

Modifications

Figure 9:
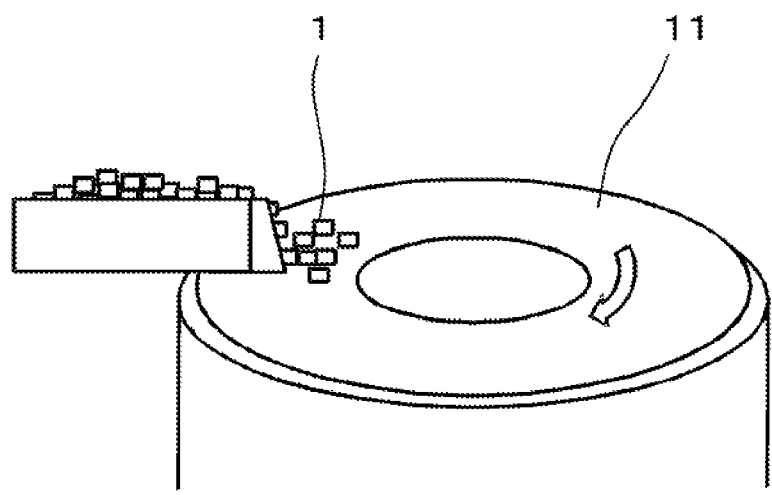
FIG. 9 is a view for describing another example of the conveyance apparatus for electronic components according to the embodiment of the present disclosure.

In the above-mentioned embodiment, the description has been made with respect to the case where the disc-like storing member 11 is rotated in a state where the storing member 11 is disposed such that the main surface 11a is disposed vertically, and the electronic components 1 stored in the cavities 11b are conveyed along with the rotation of the storing member 11. However, as shown in FIG. 9, the conveyance apparatus for electronic components may be configured such that the storing member 11 is disposed such that the main surface 11a is disposed horizontally, and the electronic components 1 supplied onto the main surface 11a are conveyed while being stored in the cavities (not shown in the drawing) formed on the storing member 11.

Figure 10:
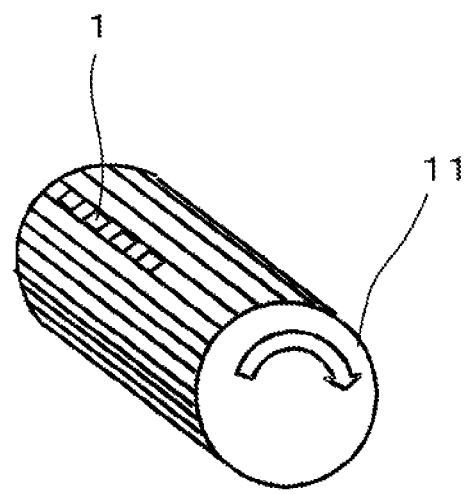
FIG. 10 is a view for describing another example of the conveyance apparatus for electronic components according to the embodiment of the present disclosure.

As shown in FIG. 10, a conveyance apparatus for electronic components may be configured such that a storing member 11 formed into a drum shape is used, electronic components 1 are stored in cavities (not shown in the drawing) formed on an outer peripheral surface of the storing member 11 by rotating the storing member 11, and the stored electronic components 1 are conveyed along with the rotation of the storing member 11.

Figure 11:
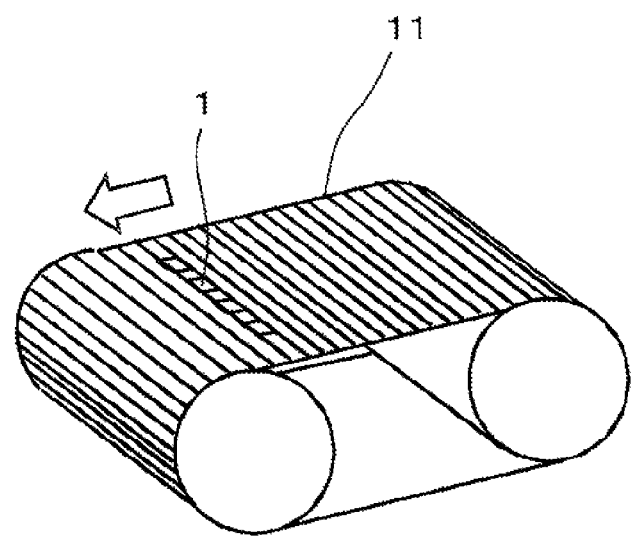
FIG. 11 is a view for describing another example of the conveyance apparatus for electronic components according to the embodiment of the present disclosure.

As shown in FIG. 11, a conveyance apparatus for electronic components may be configured such that a storing member 11 formed into an endless belt shape is used, electronic components 1 are stored in cavities (not shown in the drawing) formed on an outer peripheral surface of the storing member 11 by rotating the storing member 11, and the stored electronic components 1 are conveyed along with the rotation of the storing member 11.

Figure 12:
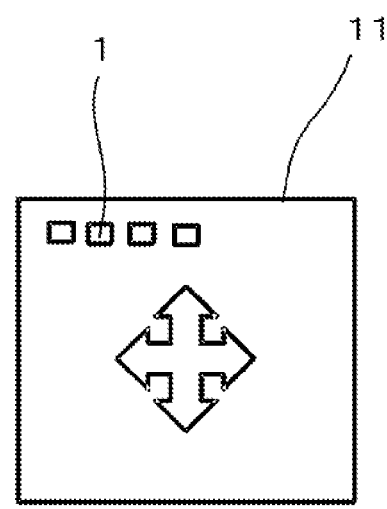
FIG. 12 is a view for describing another example of the conveyance apparatus for electronic components according to the embodiment of the present disclosure.
Figure 13:
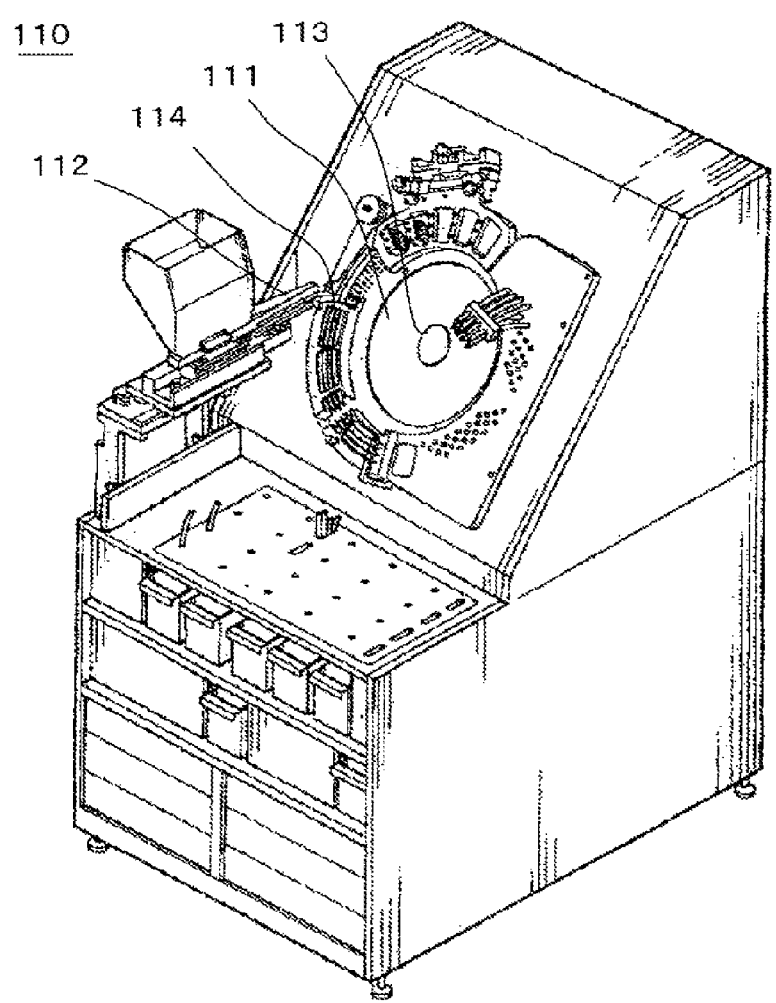
FIG. 13 is a view showing a conventional conveyance apparatus for electronic components.
Figure 14:
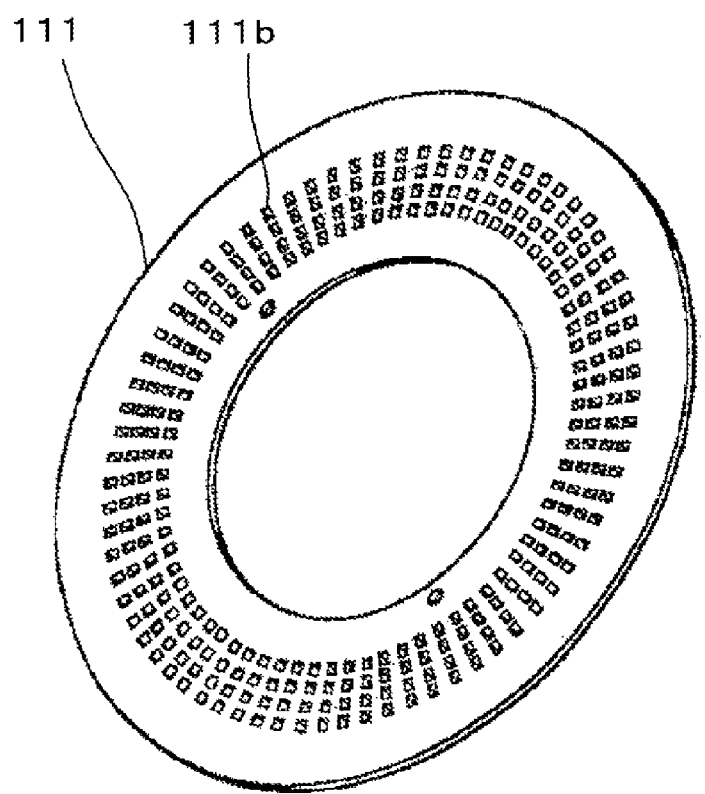
FIG. 14 is a view showing a storing member of the conventional conveyance apparatus for electronic components.

As shown in FIG. 12, a conveyance apparatus for electronic components may be configured such that a storing member 11 having a rectangular planar shape is used, the storing member 11 is moved in a reciprocating manner parallel to a main surface of the storing member 11, and the storing member 11 is tilted while being inclined so that electronic components 1 are stored in cavities (not shown in the drawing) formed on the main surface of the storing member 11, and the stored electronic components 1 are conveyed in the direction that the storing member 11 moves.

In the above-mentioned embodiments, the description has been made with respect to the case where the electronic component which is an object to be conveyed has a rectangular parallelepiped shape. However, the shape of the electronic component is not limited to a rectangular parallelepiped shape and may be a polygonal columnar shape (triangular columnar shape, hexagonal columnar shape or the like), a semicircular columnar shape or the like besides the rectangular parallelepiped shape. The electronic component is not limited to a stacked ceramic capacitor, and may be a stacked ceramic inductor, a multi-layered mounting part or the like.

To facilitate the movement of the electronic component when the electronic component is stored in the cavity formed on the storing member, a suction unit may be mounted on the vertical plate at a place corresponding to the supply zone, and the electronic component may be sucked from a back surface side of the storing member.

The present disclosure is not limited to the above-mentioned embodiments in other points, and various variations and modifications can be added within the scope of the present disclosure.

The invention claimed is:

1. A conveyance apparatus for electronic components comprising:
   a storing member which includes a plurality of cavities configured to store a plurality of electronic components respectively;
   an electronic component supply mechanism configured to supply the plurality of electronic components such that the electronic components are brought into contact with the storing member; and
   a moving unit configured to move the storing member in a predetermined moving direction in a relative relationship with the electronic component supply mechanism, wherein
   the storing member is configured to be moved so as to displace a position of the storing member relative to the electronic components while being brought into contact with the supplied electronic component so that positions of the cavities formed in the storing member with respect to the electronic components are changed whereby the electronic components are stored in the cavities, and
   a recessed portion for reducing a contact area of the storing member with the electronic components is provided in a region where the cavities are not formed on a main surface of the storing member on a side where the electronic components are supplied.

2. The conveyance apparatus for electronic components according to claim 1, wherein the recessed portion is a groove.

3. The conveyance apparatus for electronic components according to claim 1, wherein a size of the recessed portion in the moving direction of the storing member is smaller than a size of a longest side of the electronic component.

4. The conveyance apparatus for electronic components according to claim 1, wherein
- the electronic component has a rectangular parallelepiped shape with a relationship of length>width≥height, and
- a size of the recessed portion in a direction orthogonal to the moving direction of the storing member is smaller than one of the width and the height of the electronic component.

5. The conveyance apparatus for electronic components according to claim 2, wherein
- the electronic component has a rectangular parallelepiped shape with a relationship of length>width≥height,
- the storing member is rotatably moved by the moving unit about an axis of rotation thereof,
- the groove is formed concentrically about the axis of rotation of the storing member, and
- a size of the groove in a direction orthogonal to the moving direction is smaller than one of the width and the height of the electronic component.

6. The conveyance apparatus for electronic components according to claim 1, wherein
- the electronic component has a rectangular parallelepiped shape having a relationship of length>width≥height, and
- in cases where the recessed portion is located adjacent to the cavity in a direction orthogonal to the moving direction of the storing member, a distance between the cavity and the recessed portion located adjacent to each other is smaller than one of the width and the height of the electronic component.

7. The conveyance apparatus for electronic components according to claim 1, wherein
- in cases where the recessed portions are located adjacent to each other with no cavity interposed therebetween in the moving direction of the storing member, a distance between the recessed portions located adjacent to each other with no cavity interposed therebetween is set smaller than a size of a longest side of the electronic component.

8. The conveyance apparatus for electronic components according to claim 1, wherein
- in cases where the recessed portion is located adjacent to the cavity in the moving direction of the storing member, a distance between the cavity and the recessed portion located adjacent to each other is smaller than a size of a longest side of the electronic component.

9. The conveyance apparatus for electronic components according to claim 1, wherein
- the recessed portion having a size which allows a portion of the electronic component to enter the recessed portion is configured such that the center of gravity of the electronic component is positioned outside the recessed portion in a state where the portion of the electronic component enters the recessed portion and is brought into contact with a bottom surface of the recessed portion.

10. The conveyance apparatus for electronic components according to claim 9, wherein
- the electronic component has a rectangular parallelepiped shape with a relationship of length>width≥height,
- a depth of the recessed portion is smaller than a half of the height of the electronic component, and is smaller than a half of the width of the electronic component.

11. The conveyance apparatus for electronic components according to claim 1, wherein
- the electronic component has a rectangular parallelepiped shape, and
- the recessed portion having a size which allows a portion of the electronic component to enter the recessed portion has at least one of a curved portion and a projecting portion on at least a portion of a bottom surface of the recessed portion.

12. The conveyance apparatus for electronic components according to claim 1, wherein the moving direction of the storing member makes a predetermined angle with respect to a horizontal plane.

* * * * *